United States Patent [19]

Hur

[11] Patent Number: 5,306,653

[45] Date of Patent: Apr. 26, 1994

[54] METHOD OF MAKING THIN FILM TRANSISTORS

[75] Inventor: Chang W. Hur, Seoul, Rep. of Korea

[73] Assignee: Goldstar Co., Ltd., Youngdungpo, Rep. of Korea

[21] Appl. No.: 934,234

[22] Filed: Aug. 25, 1992

[30] Foreign Application Priority Data

Aug. 27, 1991 [KR] Rep. of Korea .......................... 14856

[51] Int. Cl.⁵ .......................................... H01L 21/265
[52] U.S. Cl. ..................................... 437/40; 437/229;
437/913; 148/DIG. 64; 148/DIG. 105; 148/DIG. 137
[58] Field of Search .................... 437/40, 229, 41, 913; 148/DIG. 137, DIG. 105, DIG. 150

[56] References Cited

U.S. PATENT DOCUMENTS

| | | | |
|---|---|---|---|
| 4,587,720 | 5/1986 | Chenevas-Paule et al. | 437/41 |
| 4,767,723 | 8/1988 | Hinsberg, III et al. | 437/229 |
| 4,968,638 | 11/1990 | Wright et al. | 437/40 |
| 5,071,779 | 12/1991 | Tanaka et al. | 437/40 |
| 5,091,337 | 2/1992 | Watanabe et al. | 437/41 |
| 5,130,263 | 7/1992 | Possin et al. | 437/40 |
| 5,137,841 | 8/1992 | Takeda et al. | 437/229 |

FOREIGN PATENT DOCUMENTS

63-215078 9/1988 Japan .

*Primary Examiner*—Brian E. Hearn
*Assistant Examiner*—Michael Trinh

[57] ABSTRACT

A method of making a thin film transistor exhibiting a high channel conductance includes the steps of forming, on an insulating transparent substrate, a gate electrode, an insulating layer, a semiconductor layer, a photoresist, in this order and performing a back substrate exposure at the insulating transparent substrate using the gate electrode as a photo mask, to form a photoresist pattern. The photoresist pattern is then baked to make it flow outward to a desired bottom width. The semiconductor layer is etched using the photoresist pattern as an etch mask to form a semiconductor layer pattern. On the resultant entire exposed surface are formed an ohm contact layer and a metal layer. The metal layer is then subjected to photoing and etching processes, to remove its portion disposed above the semiconductor pattern and its opposite side edge portions, thereby forming a metal layer pattern for source and drain electrodes. Using the metal layer pattern as an etch mask, the semiconductor layer is etched to form a through hole on the semiconductor layer pattern. On the resultant entire exposed surface, an insulation layer for a passivation is formed.

16 Claims, 9 Drawing Sheets

METHOD OF MAKING THIN FILM TRANSISTORS

FIELD OF THE INVENTION

The present invention relates to a method of making thin film transistors, and more particularly to a method of making thin film transistors, capable of achieving an improvement in channel conductance.

BACKGROUND OF THE INVENTION

Referring to FIGS. 1a to 1e, there are illustrated several kinds of thin film transistors as multiple carrier elements using thin films. FIGS. 1a and 1b show thin film transistors of the coplanar type wherein source and drain electrodes, an insulation layer and a gate electrode are formed over a semiconductor layer used as an active layer in an overlapped manner and in the same direction. FIGS. 1c and 1d show thin film transistors of the staggered type wherein source and drain electrodes and a gate electrode are formed at both surfaces of a semiconductor layer in opposite directions. On the other hand, FIG. 1e shows a thin film transistor of the inverted staggered type wherein an insulation layer and a semiconductor layer are formed over a gate electrode.

The material of the semiconductor layer may include CdS, CdSe, CdSSe and the like. Generally, the semiconductor layer is formed by using a method of sintering the above-mentioned materials in an inert gas atmosphere containing a proper inert gas or a small amount of oxygen at a temperature of 570° C. to 600° C., using a solvent of $CCl_2$. Alternatively, the material of the semiconductor layer may include TeInSb, $SnO_2$ and $In_2O_3$.

The material of the insulation layer may include organic materials such as nitrocellulose, glyceryl monostearate and Q-rac (made by Transene Co., Inc.) and inorganic materials such as $BaTiO_3$, $SiO_2$ and silicate cement.

On the other hand, materials of electrodes may include an Au paste, Sn, a Sn-Ga alloy (5% to 10% Sn), and an In amalgam.

The present invention concerns the inverted staggered type from the above-mentioned thin film transistors. Now, a conventional inverted staggered type thin film transistor will be described, in conjunction with FIGS. 2a and 2f.

As shown in FIG. 2a, an insulating transparent substrate 1 is first prepared. Over the transparent substrate 1, a metal layer for a gate electrode is deposited which is in turn subjected to a patterning, to form a gate electrode 2.

On the exposed surfaces of transparent substrate 1 and gate electrode 2, an insulating layer 3 is formed to insulate the gate electrode 2, as shown in FIG. 2b. A semiconductor layer 4 as a channel layer is then formed on the insulating layer 3. On the semiconductor layer 4 is formed another semiconductor layer 5 of a predetermined conductivity type (n type or p type) doped with the same conductivity type impurity ions for reducing contact resistance between the source and drain electrode and the semiconductor layer 4. Thereafter, the semiconductor layers 4 and 5 are patterned so that unnecessary portions of their opposite side edges are removed, as shown in FIG. 2d. After patterning, side surfaces of the patterned semiconductor layers 4 and 5 are exposed.

Subsequently, a metal layer 6 for source and drain electrodes is formed on the resultant exposed surface, as shown in FIG. 2e. Together with the semiconductor layer 5, the metal layer 6 is then subjected to a patterning so that their portions disposed above the gate electrode 2 are removed, as shown in FIG. 2f. By the patterning, unnecessary portions of opposite side edges of the metal layer 6 are also removed. At this time, opposite side edges of the semiconductor layers 4 and 5 are still covered with the metal layer 6. Thus, a through hole region 7, source and drain electrodes 6a and 6b are formed above the semiconductor layer 4.

Finally, an insulation layer 8 for a passivation is formed on the resultant exposed surfaces of the source and drain electrode 6a and 6b and the portion of semiconductor layer 4 corresponding to the through hole region 7.

The operation of the obtained conventional inverted staggered type thin film transistor shown in FIG. 2f will now be described.

As a voltage of about +10 V is applied to the gate electrode 2, electrons are generated at a boundary surfaces between the insulation layer 3 and the semiconductor layer 4 disposed on the insulation layer 3, so that a channel is formed at the semiconductor layer 4. At this time, an application of voltage of about +10 V between the source and drain electrodes 6a and 6b causes a current to flow through the channel. The current flows from the source electrode 6a, via the semiconductor layer 5, the boundary surfaces between the semiconductor layer 4 and the insulating layer 3 and then the semiconductor layer 5, to the drain electrode 6b.

However, the thin film transistor obtained by the conventional method has the following problems.

The source and drain electrodes are in contact with the semiconductor layer as the channel at their large portions, as shown in FIG. 3a. As a result, a vertical series resistance Rs of the semiconductor layer 4 is very large at sides of source and drain electrodes, as compared with contact resistances generated between semiconductor layers 4 and 5 and between the semiconductor layer 5 and the source and drain electrodes 6a and 6b. Otherwise, the value of channel conductance is decreased, so that a voltage drop is generated in the channel. Consequently, a voltage lower than the actually applied voltage is present between source and drain electrodes, resulting in a degradation in operational characteristic of the thin film transistor.

SUMMARY OF THE INVENTION

Therefore, an object of the invention is to overcome the drawbacks encountered in the prior art and to provide a method of making a thin film transistor, wherein source and drain electrodes are in contact only with side surfaces of a semiconductor layer as a channel layer, to reduce a series resistance generated in a channel, thereby improving a channel conductance. As shown in FIG. 3b, the contact between the semiconductor layer and the meal layer is directly connected to the channel portion, thereby reducing the series resistance $R_S$.

In accordance with the present invention, this object can be accomplished by providing a method of making a thin film transistor comprising the steps of: forming a gate electrode having a predetermined length on an insulating transparent substrate; forming, on the resultant entire exposed surface, an insulating layer, a semiconductor layer, a photoresist, in this order; performing a back substrate exposure at the insulating transparent substrate using the gate electrode as a photo mask, to form a photoresist pattern; etching the semiconductor layer together with the insulation layer using the photoresist pattern as an etch mask to form a semiconductor layer pattern; forming, on the resultant entire exposed surface, an ohm contact layer of a predetermined conductivity type for reducing a contact resistance; depositing a metal layer over the ohm contact layer and then photoing and etching the metal layer to remove its portion disposed above the semiconductor pattern and its opposite side edge portions, thereby forming a metal layer pattern for source and drain electrodes; etching the ohm contact layer using the metal layer pattern as an etch mask to form, on the semiconductor layer pattern, a through hole for making the metal layer pattern come into contact with other upper electrodes to be subsequently formed; and forming an insulation layer for a passivation on the resultant entire exposed surface.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 4a to 4g, there is illustrated a method of making a thin film transistor in an embodiment of the present invention.

Figure 4A:
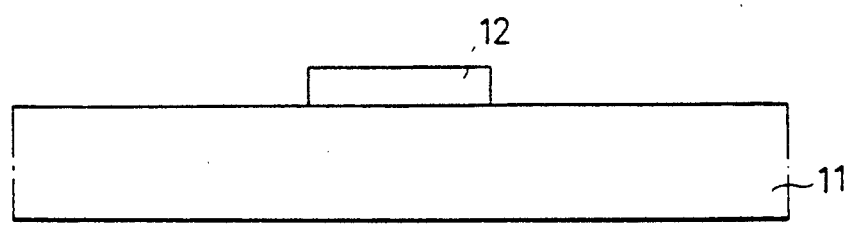
FIGS. 4a to 4g are sectional views of the inverted staggered type thin film transistor in accordance with the present invention.
Figure 4B:
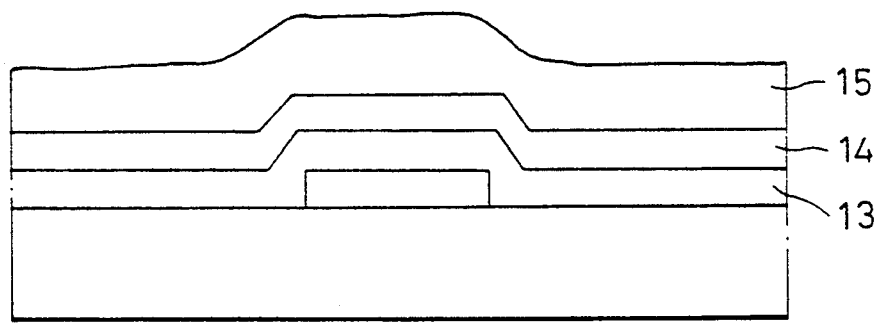

In accordance with the method of the present invention, a glass substrate 11 as an insulating transparent substrate is first prepared, as shown in FIG. 4a. Over the glass substrate 11, a metal layer such as an aluminum layer is deposited using a thermal vaporization method, to have a thickness of 500 Å to 2,000 Å. Thereafter, the aluminum layer is subjected to a patterning, to form a gate electrode 12 having a predetermined length. In place of the aluminum, the material of gate electrode 12 may include chromium, titanium, molybdenum or tungsten. Alternatively, a polycrystalline silicon may be used which is doped with impurity ions of a predetermined conductivity type. On the other hand, the material of the insulating transparent substrate may be quartz.

In place of the thermal vaporization method, an E-beam deposition method or a sputtering method may be used as the metal deposition method.

Over the exposed surfaces of the glass substrate 11 and gate electrode 12, an amorphous silicon (a-SiN:H) layer 13 as an insulation layer for insulating the gate electrode 12 is deposited using a plasma enhanced chemical vapor deposition (PECVD) method, a chemical vapor deposition (CVD) method or a sputtering method, to have a thickness of 500 Å to 2,000 Å.

In place of the a-SiN:H, the material of the insulation material may include a-SiO$_x$N$_y$:H, SiO$_2$, Al$_2$O$_3$-SiN, Al$_2$O$_3$-SiO$_2$, Ta$_2$O$_5$, Ta$_2$O$_5$-SiN and Ta$_2$O$_5$-SiO$_2$. Alternatively, other dielectric materials may be used.

Subsequently, another amorphous silicon (a-Si:H) layer 14 as a semiconductor layer for forming a channel at the amorphous silicon layer 13 is deposited using one of PECVE method, low pressure (LP) CVD method and CVD method. The amorphous silicon layer 14 has a thickness of 1,000 Å to 1 um. In place of the a-Si:H, the material of the semiconductor layer 14 may include polycrystalline silicon, CdSe, CdS or CdSSe.

Over the amorphous silicon layer 14, a photoresist layer 15 having a thickness of 1 um to 3 um is then coated using a spin coating method.

Figure 4C:
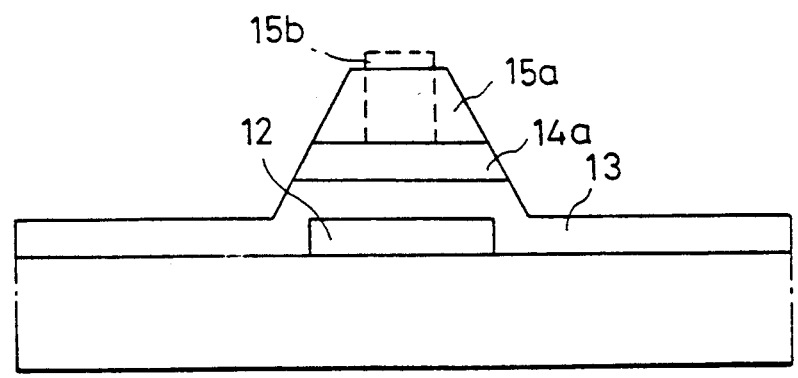
Figure 4D:
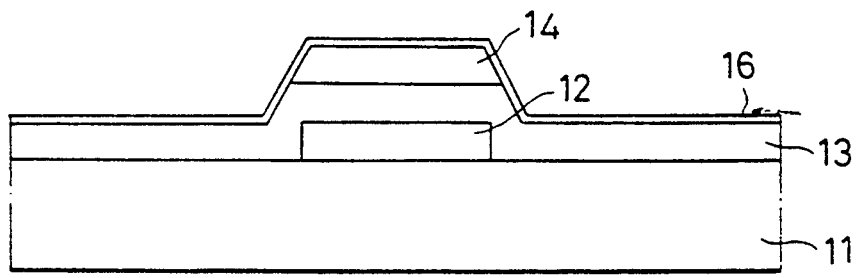

Thereafter, the photoresist 15 is subjected to a back substrate exposure which is carried out at the back side of the transparent substrate 11, using the gate electrode 12 as a photo mask, thereby forming a photoresist pattern 15b, as shown in FIG. 4c.

By the back substrate exposure, the photoresist pattern 15b is generally formed which has a bottom width shorter than the length of the gate electrode 12. The photoresist pattern 15b is subjected to a baking at a temperature of 100° C. to 300° C. so that it flows outwardly to obtain the photoresist pattern 15a having a desired bottom width. It is preferred that the bottom width of photoresist pattern 15a is approximately equal to the length of gate electrode 12.

Using the photoresist pattern 15a as an etch mask, the amorphous silicon layer 14 is etched according to a reaction ion etching (RIE) method, thereby forming am amorphous silicon layer pattern 14a as a channel layer. After etching, the photoresist pattern 15a is removed. In place of a-Si:H, the material of amorphous silicon layer 14 may include polycrystalline silicon.

The RIE method uses a gas atmosphere which contains CF$_4$ +O$_2$, CCl$_2$F$_2$+O$_2$, CHF$_3$+O$_2$ or CCl$_4$+O$_2$.

Over the resultant exposed surfaces of amorphous silicon layer pattern 14a and amorphous silicon layer 13, an amorphous silicon (a-Si:H) layer 16 of the N+ type doped with high concentration N (N+) type impurity ions is then deposited using one of PECVD, photo CVD, LPCVD and CVD methods, to have a thickness of 200 Å to 1,000 Å. As a doping gas for forming the amorphous silicon layer 16, PH$_3$ (SiH$_4$ or Si$_2$H$_6$)+H$_2$O can be used.

The amorphous silicon layer 16 is used as an ohm contact layer adapted to minimize the junction resistance between the amorphous silicon layer 14 and metallic source and drain electrodes to be subsequently formed. By virtue of this ohm contact layer, the contact potential difference between the amorphous silicon layer 14 and metallic source and drain electrodes is constant.

In order to improve its characteristic, the ohm contact layer is subjected to an annealing process which is carried out in a furnace or oven including an inert gas atmosphere of N$_2$, H$_2$ and Ar at a temperature of 200° C. to 300° C., just after the formation of amorphous silicon layer 16. Of source, this process may be omitted.

In place of the N+a-Si:H, the ohm contact layer may include P+a-Si:H. In this case, B$_2$H$_6$ is used a doping gas.

Figure 4E:
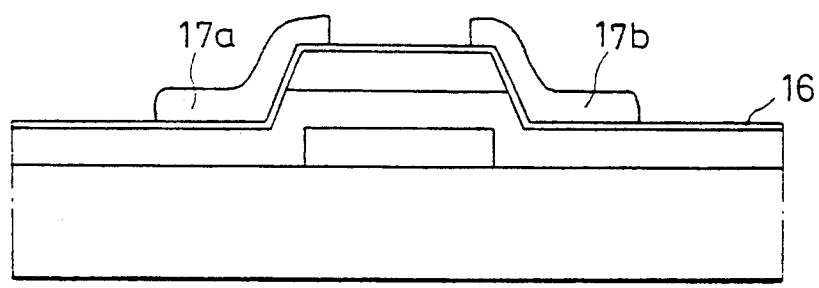

Thereafter, a metal layer for forming source and drain electrodes is deposited using the CVD method, to have a thickness of 1,000 Å to 1 um, as shown in FIG. 4e. The material of the metal layer may be aluminum. In place of the aluminum, the material may include Cr, Ta, Ti, Mo, W, and their alloys such as MoTa. The metal layer may have a double layer structure which includes two layers made of different ones selected from the above-mentioned metal materials, respectively. The deposition method used in forming the metal layer may be the PECVD method or the LPCVD method.

The aluminum layer is then subjected to a photo process and a dry etching process so that it is removed at its portion disposed above the gate electrode 12 and its opposite side edge portions. The remaining portions of the aluminum layer form a source electrode 17a and a drain electrode 17b. As the dry etching process, the RIE method or the plasma etching method is used.

The source and drain electrodes 17a and 17b are in contact only with the side surfaces and upper surface portions of the amorphous silicon layer pattern 14a.

Figure 4F:
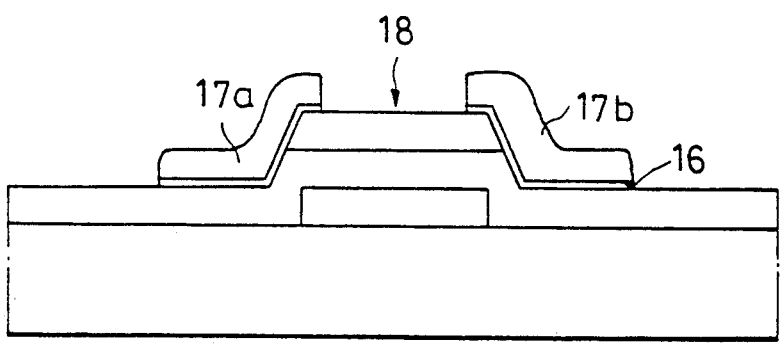

Using the source and drain electrodes 17a and 17b as an etch mask, the amorphous silicon layer 16 is subjected to a RIE or a plasma etching so that a through hole is formed at the amorphous silicon layer pattern 14a while unnecessary portions of opposite side edges of the amorphous silicon layer 16 are removed, as shown in FIG. 4f.

Figure 4G:
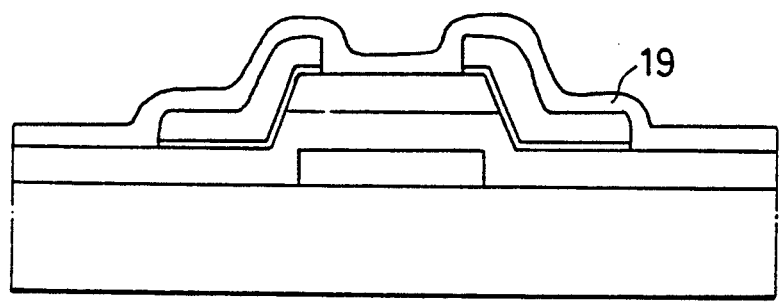

Over the resultant entire exposed surface, an insulation layer 19 for a passivation is finally formed, as shown in FIG. 4g.

The function of the through hole is to make the lower electrodes come into contact with the upper electrodes. That is, the through hole makes the lower gate electrode and source and drain electrodes come into contact with the upper pad and another electrode. This function of the through hole has no relation with the present invention, and thus its illustration and detailed description are omitted.

Figure 5:
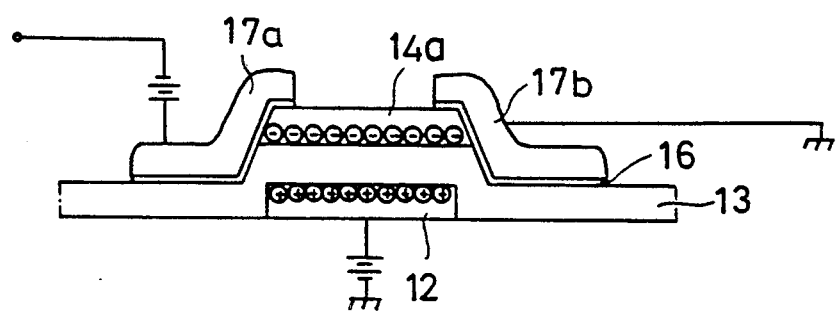
FIG. 5 is a schematic view explaining the operation of the inverted staggered type thin film transistor in accordance with the present invention.

The operation of the inverted staggered type thin film transistor made according to the method of the present invention will now be described, in conjunction with FIG. 5.

As a voltage is applied to the gate electrode 12, positive and negative electric charges are uniformly generated at the surface of gate electrode 12 and the boundary surfaces between the amorphous silicon layer 13 and the amorphous silicon layer pattern 14a, respectively. As a result, as a predetermined potential difference occurs between source and drain electrodes 17a and 17b, a signal current can flow through the amorphous silicon layer pattern 14a between source and drain electrodes 17a and 17b.

Figure 1A:
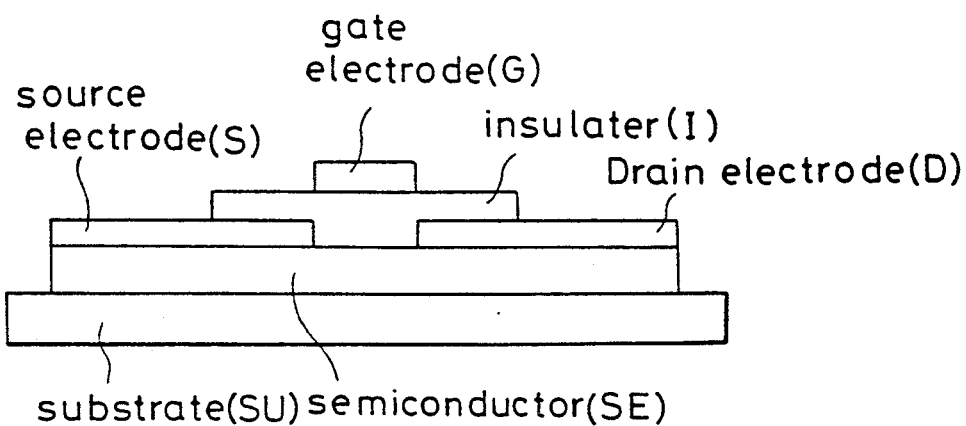
FIGS. 1a to 1e are sectional views illustrating different kinds of conventional thin film transistors.
Figure 1B:
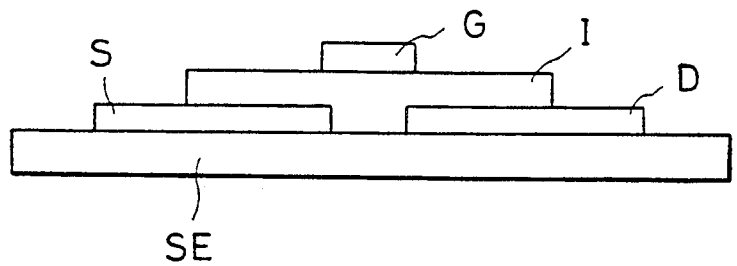
Figure 1C:
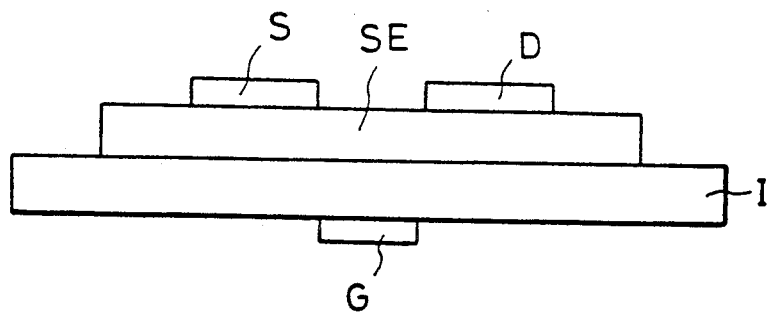
Figure 1D:
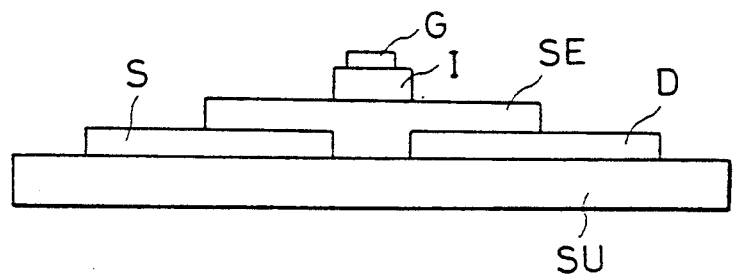
Figure 1E:
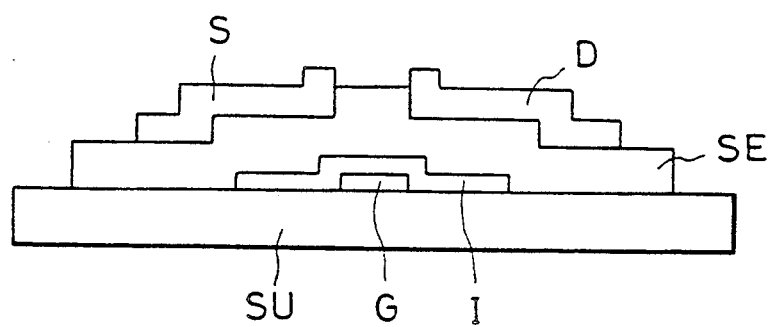
Figure 2A:
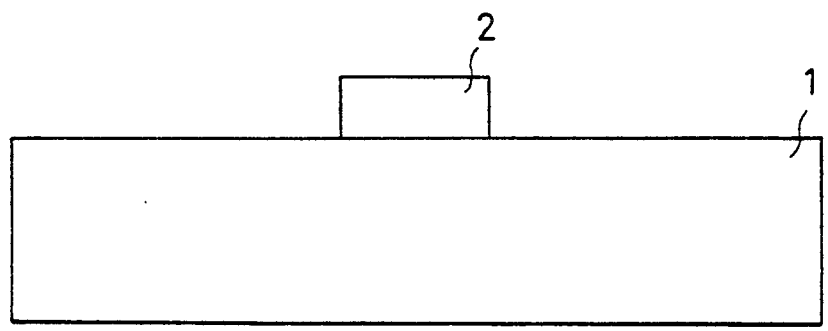
FIGS. 2a to 2f are sectional views of a method producing of a conventional inverted staggered type thin film transistor.
Figure 2B:
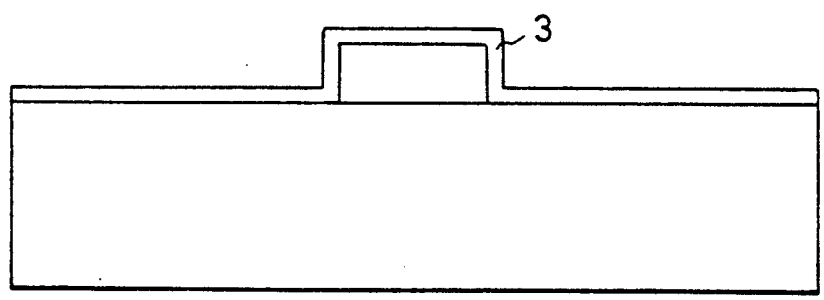
Figure 2C:
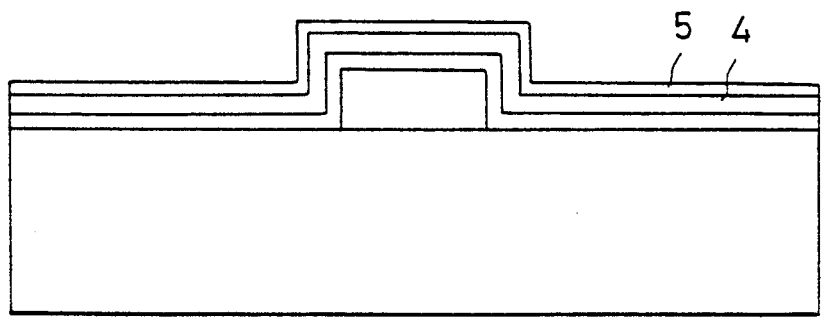
Figure 2D:
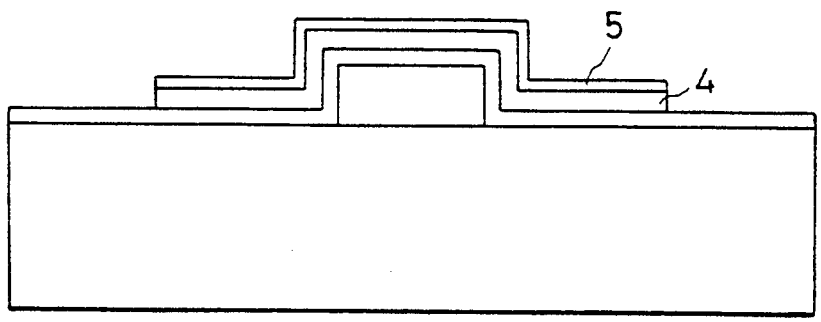
Figure 2E:
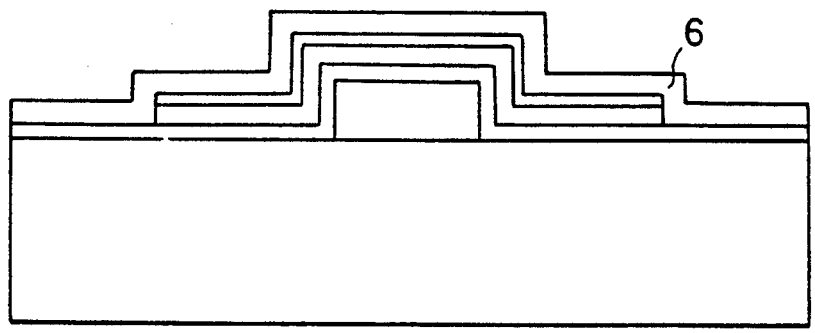
Figure 2F:
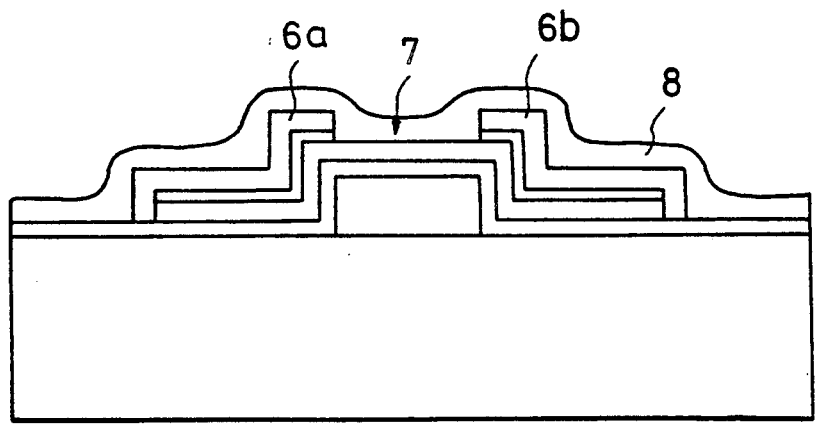
Figure 3A:
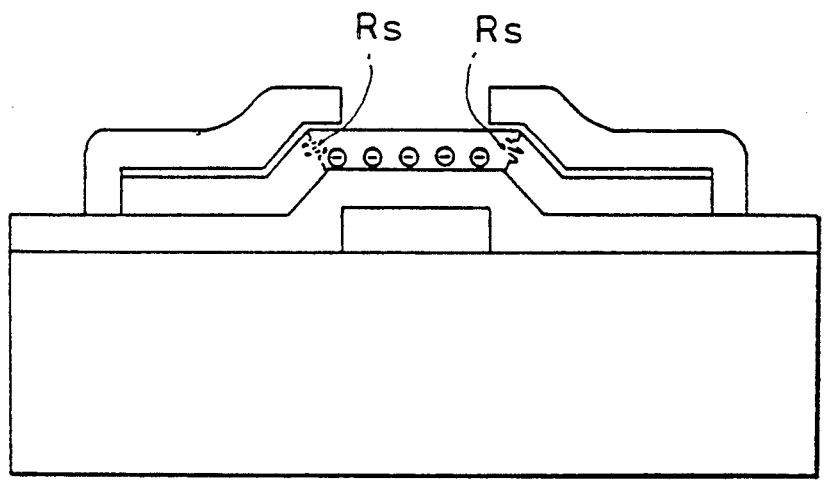
FIG. 3a is a schematic view explaining a series resistance of the conventional inverted staggered type thin film transistor.
Figure 3B:
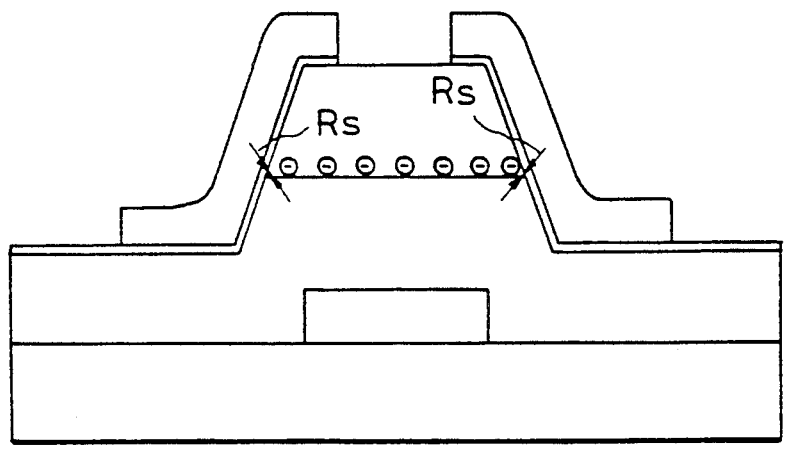
FIG. 3b is a schematic view explaining a series resistance of an inverted staggered type thin film transistor in accordance with the present invention.

As apparent from the above description, the source and drain electrodes are connected with the amorphous silicon layer pattern which is the channel layer, only via the side surfaces and upper surface portions of the amorphous silicon layer pattern, thereby causing only a small series resistance $R_S$ to occur, as shown in FIG. 3b. As a result, it is possible to increase the channel conductance. Also, no voltage drop occurs at the channel, thereby preventing a degradation of the operational characteristic of the thin film transistor.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a thin film transistor, comprising the steps of:
   (a) forming a gate electrode having a desired length of an insulating transparent substrate, thereby obtaining a first resultant structure;
   (b) forming, entire on the first resultant structure, an insulating layer, a semiconductor layer, and a photoresist, in this order;
   (c) performing a back substrate exposure at the insulating transparent substrate using the gate electrode as a photo mask, to form a photoresist pattern;
   (d) baking the photoresist pattern to make it flow outwardly for obtaining a desired bottom width thereof;
   (e) etching the semiconductor layer together with the insulation layer using the photoresist pattern as an etch mask to form a semiconductor layer pattern;
   (f) removing the photoresist pattern, thereby obtaining a second resultant structure;
   (g) forming, entire on the second resultant structure, an ohm contact layer for reducing a contact resistance;
   (h) depositing a metal layer over the ohm contact layer and then photoing and etching the metal layer to remove its portion disposed above the semiconductor pattern and its opposite side edge portions, thereby forming a metal layer pattern for source and drain electrodes;
   (i) etching the ohm contact layer using the metal layer pattern as an etch mask to form, on the semiconductor layer pattern, a through hole for making the metal layer pattern come into contact with other upper electrodes to be subsequently formed, thereby obtaining a third resultant structure; and
   (j) forming an insulation layer for a passivation, entire on the third resultant structure.

2. The method of making a thin film transistor in accordance with claim 1, wherein said desired bottom width of the photoresist pattern is approximately equal to said desired length of the gate electrode.

3. The method of making a thin film transistor in accordance with claim 1, further comprising the step of annealing the ohm contact layer after the step (g), but before the step (h).

4. The method of making a thin film transistor in accordance with claim 1, wherein at the step (e), the semiconductor layer is etched such that the photoresist pattern is vertically aligned with the remaining portion of the insulation layer and the semiconductor layer pattern at their opposite side surfaces.

5. The method of making a thin film transistor in accordance with claim 1, wherein the material of the insulating transparent substrate is one of quartz and glass.

6. The method of making a thin film transistor in accordance with claim 1, wherein the material of the gate electrode is one selected from a group consisting of aluminum, chromium, titanium, molybdenum, tungsten and polycrystalline silicon.

7. The method of making a thin film transistor in accordance with claim 1, wherein the material of the semiconductor layer is one of amorphous silicon and polycrystalline silicon.

8. The method of making a thin film transistor in accordance with claim 1, wherein conductivity type of the ohm contact layer is N conductivity type.

9. The method of making a thin film transistor in accordance with claim 1, wherein conductivity type of the ohm contact layer is P conductivity type.

10. The method of making a thin film transistor in accordance with claim 8, wherein the material of the N conductivity type ohm contact layer is one selected from a group consisting of CdSe, CdSSe, CdS, polycrystalline silicon and amorphous silicon doped with high concentration N conductivity type impurity ions.

11. The method of making a thin film transistor in accordance with claim 9, wherein the material of the P conductivity type ohm contact layer is one selected from a group consisting of CdSe, CdSSe, CdS, polycrystalline silicon and amorphous silicon doped with high concentration P conductivity type impurity ions.

12. The method of making a thin film transistor in accordance with claim 10, wherein the N conductivity type impurity ions to be doped are provided by a doping gas of $PH_3+SiH_4+H_2O$.

13. The method of making a thin film transistor in accordance with claim 10, wherein the N conductivity type impurity ions to be doped are provided by a doping gas of $PH_3+Si_2H_6+H_2O$.

14. The method of making a thin film transistor in accordance with claim 11, wherein the P conductivity type impurity ions to be doped are provided by a doping gas of $B_2H_6$.

15. The method of making a thin film transistor in accordance with claim 1, wherein the material of the insulating layer is one selected from a group consisting of a-SiN:H, a-SiO$_x$N$_y$:H, $SiO_2$, $Al_2O_3$-$SiO_2$, $Ta_2O_5$-SiN and $Ta_2O_5$-$SiO_2$.

16. The method of making a thin film transistor in accordance with claim 1, wherein all etchings used at the steps (e), (h) and (i) are a reaction ion etching process.

* * * * *